US011293944B2

(12) United States Patent
Nakamura et al.

(10) Patent No.: US 11,293,944 B2
(45) Date of Patent: Apr. 5, 2022

(54) TEST SOCKET

(71) Applicant: Yamaichi Electronics Co., Ltd., Tokyo (JP)

(72) Inventors: Yuji Nakamura, Tokyo (JP); Masashi Iwata, Tokyo (JP)

(73) Assignee: YAMAICHI ELECTRONICS CO., LTD., Tokyo (JP)

( * ) Notice: Subject to any disclaimer, the term of this patent is extended or adjusted under 35 U.S.C. 154(b) by 353 days.

(21) Appl. No.: 16/366,093

(22) Filed: Mar. 27, 2019

(65) Prior Publication Data
US 2019/0302144 A1    Oct. 3, 2019

(30) Foreign Application Priority Data

Mar. 30, 2018  (JP) .............................. JP2018-068179

(51) Int. Cl.
*G01R 1/04*      (2006.01)
*G01R 1/067*     (2006.01)
(Continued)

(52) U.S. Cl.
CPC .......... *G01R 1/045* (2013.01); *G01R 1/06711* (2013.01); *G01R 1/06772* (2013.01);
(Continued)

(58) Field of Classification Search
CPC ................ G01R 1/045; G01R 1/06711; G01R 1/07307; G01R 1/073; G01R 1/0466;
(Continued)

(56) References Cited

U.S. PATENT DOCUMENTS 5,302,923 A * 4/1994 Mason ............... H01R 13/6585
                                                    333/33
6,556,033 B1   4/2003 Kazama
(Continued)

FOREIGN PATENT DOCUMENTS

JP    2001099889 A   4/2001
JP    2004150927 A   5/2004
(Continued)

OTHER PUBLICATIONS

Extended European Search Report dated Sep. 5, 2019 in corresponding application 19158271.7.
(Continued)

*Primary Examiner* — Huy Q Phan
*Assistant Examiner* — Dustin R Dickinson
(74) *Attorney, Agent, or Firm* — Muncy, Geissler, Olds & Lowe, P.C.

(57) ABSTRACT

The test socket includes a fifth housing 15 located in a central part of contact terminals 21 in an axial direction and having electrical conductivity, plural through-holes 15c being formed in the fifth housing 15 to pass the respective contact terminals 21 therethrough; a sixth housing 16 stacked in the axial direction on the fifth housing 15, passage holes being formed in the sixth housing 16, the passage holes being configured to position the contact terminals 21 in a direction orthogonal to the axial direction; and an eighth housing 18 having electrical conductivity and stacked in the axial direction by sandwiching the sixth housing 16 between the eighth housing 18 and fifth housing 15, wherein the sixth housing 16 is provided with through-vias configured to form a conductive path in the axial direction.

11 Claims, 13 Drawing Sheets

(51) Int. Cl.
  *H01R 13/24*       (2006.01)
  *H01R 24/50*       (2011.01)
  *H05K 7/10*        (2006.01)
  *H01R 13/6473*     (2011.01)
  *H01R 12/73*       (2011.01)
  *H01R 12/71*       (2011.01)

(52) U.S. Cl.
  CPC .......... *H01R 12/714* (2013.01); *H01R 12/73* (2013.01); *H01R 13/2421* (2013.01); *H01R 13/6473* (2013.01); *H01R 24/50* (2013.01); *H05K 7/1061* (2013.01)

(58) Field of Classification Search
  CPC ............ G01R 1/06722; G01R 1/07314; H02R 12/714; H02R 12/73; H02R 13/2421; H02R 24/50; H01R 13/6473; H05K 7/1061; H05K 7/1069
  See application file for complete search history.

(56) References Cited

U.S. PATENT DOCUMENTS

| | | | |
|---|---|---|---|
| 6,953,348 | B2 | 10/2005 | Yanagisawa et al. |
| 7,102,373 | B2 | 9/2006 | Yoshida |
| 7,489,147 | B2 | 2/2009 | Kimura et al. |
| 7,656,175 | B2 | 2/2010 | Fukushima et al. |
| 8,758,066 | B2 | 6/2014 | Zhou et al. |
| 8,911,266 | B2 | 12/2014 | Kawate et al. |
| 8,994,393 | B2 | 3/2015 | Ding et al. |
| 2004/0212383 | A1* | 10/2004 | Yanagisawa ......... G01R 1/0441 324/754.08 |
| 2007/0145990 | A1 | 6/2007 | Fukushima et al. |
| 2007/0269999 | A1 | 11/2007 | Di Stefano |
| 2008/0088331 | A1 | 4/2008 | Yoshida |
| 2009/0212798 | A1* | 8/2009 | Kasukabe .......... G01R 1/07378 324/754.07 |
| 2010/0188112 | A1 | 7/2010 | Yoshida |
| 2014/0203829 | A1 | 7/2014 | Yamada |
| 2016/0154024 | A1 | 6/2016 | Miyagawa |
| 2016/0216294 | A1* | 7/2016 | Kaashoek .......... G01R 1/06722 |
| 2018/0238957 | A1 | 8/2018 | Nakamura et al. |

FOREIGN PATENT DOCUMENTS

| | | |
|---|---|---|
| JP | 2004325305 A | 11/2004 |
| JP | 2006098375 A | 4/2006 |
| JP | 2007-178165 A | 7/2007 |
| JP | 2008070146 A | 3/2008 |
| JP | 2009-115463 A | 5/2009 |
| JP | 2009129877 A | 6/2009 |
| JP | 2009156710 A | 7/2009 |
| JP | 2011-252766 A | 12/2011 |
| JP | 6231994 B2 | 3/2015 |
| JP | 2016-191553 A | 11/2016 |
| JP | 2017076587 A | 4/2017 |
| WO | WO 00/03250 A1 | 1/2000 |
| WO | WO 2006/009070 A1 | 1/2006 |
| WO | WO2011153054 A2 | 12/2011 |

OTHER PUBLICATIONS

Japanese Office Action for Japanese Application No. 2018-068179 dated Nov. 9, 2022 with English Translation.

* cited by examiner

TEST SOCKET

TECHNICAL FIELD

The present invention relates to a test socket used to inspect electronic devices such as IC packages.

BACKGROUND ART

To remove potential defects, electronic devices such as IC packages and the like to be mounted on electronic equipment and the like are generally tested using a test socket before being mounted on a wiring board. As shown, for example, in PTL 1, a test socket is put on a printed circuit board (test board) used as a test board or mounting board.

When the test socket is installed, for example, in a transmission channel on which RF (Radio Frequency) signals at 1 GHz or higher is transmitted, an impedance-matching method is commonly used to improve signal transmission performance of the test socket in a high frequency band. For this, a test socket made up of a coaxial probe is used as with PTL 1. Specifically, by forming an air space between an outer periphery of a contact terminal and an insertion hole of a metal block into which the contact terminal is inserted, a coaxial probe is constructed using a signal contact terminal as a central conductor, and an inner wall of the insertion hole as an outer conductor.

CITATION LIST

Patent Literature

[PTL 1]
The Publication of Japanese Patent No. 4242199

SUMMARY OF INVENTION

Technical Problem

According to PTL 1, positioning is done by supporting the contact terminal using an insulating substrate stacked on a metal block such that the contact terminal and insertion hole will be concentric.

However, in a region where the insulating substrate supports the contact terminal, because the insulating substrate does not act as an outer conductor, a coaxial probe cannot be formed between the insulating substrate and contact terminal, which disables impedance matching. Therefore, there is a problem in that characteristics deteriorate with respect to high frequency signals, for example, in excess of 10 GHz under the influence of reflection and crosstalk and sufficient performance is not available.

The present invention has been made in view of the above circumstances and has an object to provide a test socket that allows impedance matching to be performed accurately.

Solution to Problem

A test socket according to one aspect of the present invention comprises: a plurality of contact terminals each having a device-side end portion at one end in an axial direction and a substrate-side end portion at another end on a side opposite the device-side end portion, the device-side end portion being configured to come into contact with a device under test, the substrate-side end portion being configured to come into contact with a test board; a central housing located in a central part of the contact terminals in the axial direction and having electrical conductivity, a plurality of through-holes being formed in the central housing to pass the respective contact terminals therethrough; a positioning resin substrate stacked in the axial direction on the central housing, locating holes being formed in the positioning resin substrate, the locating holes being configured to position the contact terminals in a direction orthogonal to the axial direction; and an end-side housing having electrical conductivity and stacked in the axial direction by sandwiching the positioning resin substrate between the end-side housing and the central housing, wherein the positioning resin substrate includes a conductive portion configured to form a conductive path in the axial direction.

By stacking the positioning resin substrate on the central housing and passing the contact terminals through the locating holes in the positioning resin substrate, the contact terminals are positioned in a direction orthogonal to the axial direction. Consequently, impedance matching is performed accurately.

Since the positioning resin substrate includes the conductive portion configured to form a conducting path in the axial direction, electricity is conducted between the central housing and end-side housing via the positioning resin substrate. Consequently, impedance matching can be performed accurately despite the interposition of the positioning resin substrate. Therefore, inspection can be performed accurately on high frequency signals, for example, in excess of 10 GHz. Structures available for use as the electrically conductive housing include, for example, an integral structure or layered structure made of metal such as an aluminum alloy and a stack of plural rigid substrates with electrically conductive layers provided on front and back surfaces.

Note that anther member having electrical conductivity in a stacking direction may be stacked between the positioning resin substrate and central housing, and/or between the positioning resin substrate and end-side housing.

Furthermore, in the test socket according to one aspect of the present invention, each of the contact terminals includes a device-side plunger having the device-side end portion, a substrate-side plunger having the substrate-side end portion, and a barrel provided between the device-side plunger and the substrate-side plunger and configured to support a base end side of the device-side plunger and a base end side of the substrate-side plunger reciprocally in the axial direction; and g resin substrate are placed in contact with the barrel.

Whereas the device-side plunger and substrate-side plunger reciprocate in the axial direction, the barrel does not reciprocate in the axial direction. Therefore, by positioning the contact terminals with the locating holes placed in contact with the barrels, positioning can be done more accurately.

Furthermore, the test socket according to one aspect of the present invention further comprises a guiding resin substrate provided with a conductive portion configured to form a conductive path in the axial direction, guide holes being formed in the guiding resin substrate to guide reciprocating motion of the device-side plunger and/or the substrate-side plunger in the axial direction.

The guiding resin substrate provided with the guide holes configured to guide the reciprocating motion of the plungers allows the plungers to be reciprocated accurately along the axial direction. This makes it possible to prevent the plungers from touching surrounding components (e.g., electrically conductive housings) by inhibiting inclination of motion from the axial directions of the plungers even if reciprocating strokes of the plungers are long and thereby prevent malfunctions.

As with the positioning resin substrate, since the guiding resin substrate is provided with the conductive portion configured to form a conductive path in the axial direction, by conducting electricity in the stacking direction, impedance matching can be performed accurately.

Furthermore, in the test socket according to one aspect of the present invention, the positioning resin substrate and/or the guiding resin substrate are printed circuit boards/is a printed circuit board.

A printed circuit board (PCB) can be used as the resin substrate. The printed circuit board, whose manufacturing process has technically been established, can be produced with high processing accuracy at relatively low cost. Also, if a rigid substrate having rigidity is used as the printed circuit board, board thickness can be reduced and the influence on impedance matching can be minimized.

Also, as the printed circuit board, plural layers of rigid substrates may be provided or only flexible substrates or a combination of a flexible substrate and rigid substrate may be used.

Furthermore, in the test socket according to one aspect of the present invention, the conductive portion includes electrically conductive layers formed on front and back surfaces of the positioning resin substrate and/or the guiding resin substrate, and through-vias provided to conduct electricity between the electrically conductive layer(s) on the front surface(s) and the electrically conductive layer(s) on the back surface(s).

By forming electrically conductive layers (e.g., metal layers) on the front and back surfaces of the resin substrate(s) and providing through-vias between the electrically conductive layers on the front and back surfaces, a conductive path can be formed in the stacking direction (board thickness direction) of the resin substrate(s).

The through-vias may be provided separately from the locating holes and guide holes or the locating holes or guide holes may be used as the through-vias. When the locating holes or guide holes are used as the through-vias, for example, locating holes or guide holes corresponding to grounding contact terminals are used. However, locating holes or guide holes formed as signal contact terminals or power-supply contact terminals are kept insulated without being provided with conductive portions.

Furthermore, in the test socket according to one aspect of the present invention, the contact terminals include a signal contact terminal and a power-supply contact terminal; and the through-vias are provided between the locating hole and/or the guide hole through which the signal contact terminal is passed and the locating hole and/or the guide hole through which the power-supply contact terminal is passed.

The signal contact terminal and power-supply contact terminal may become electrically coupled in a region of a resin substrate and might be affected by crosstalk. Thus, crosstalk is reduced by providing a through-via between the signal contact terminal and power-supply contact terminal.

Furthermore, the test socket according to one aspect of the present invention further comprises a device-side housing placed in contact with the device under test; and a substrate-side housing placed in contact with the test board, wherein an insulating layer is formed in a region of the device-side housing, the region of the device-side housing being placed in contact with the device under test, and/or an insulating layer is formed in a region of the substrate-side housing, the region of the substrate-side housing being is placed in contact with the test board.

Since an insulating layer is formed in that region of a housing which is placed in contact with the device under test and/or an insulating layer is formed in that region of a housing which is placed in contact with the test board, short circuits with the housings can be prevented. As the insulating layers, for example, an anodic oxide film of anodized aluminum or the like or an insulating film formed by coating can be used.

Advantageous Effects of Invention

Since the contact terminals are positioned by the positioning resin substrate provided with the conductive portion configured to form a conductive path in the axial direction, impedance matching can be performed accurately.

DESCRIPTION OF EMBODIMENTS

An embodiment of the present invention will be described below with reference to the drawings.

Figure 1A:
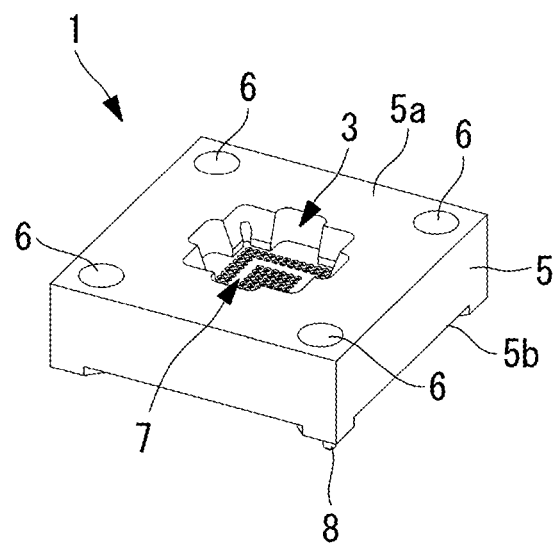
FIG. 1A is a perspective view showing a test socket.

A test socket 1 (hereinafter referred to simply as a "socket 1") is shown in FIG. 1A. The socket 1 is placed, for example, on a printed circuit board (test board) serving as a test board. The socket 1 has a recess 3 formed in center and is designed to be installed with a device under test, such as an IC package, inserted in the recess 3. In terms of package shape, the IC packages used include BGA (Ball Grid Array) packages as with the present embodiment. Other IC packages used include, for example, LGA (Land Grid Array) packages and QFNs (Quad Flat Non-leaded packages).

The socket 1 includes a socket base 5 forming an outside shape. The socket base 5 is in the shape of a rectangular parallelepiped with a substantially square top face 5a and bottom face 5b. The socket base 5 is made of metal such as an aluminum alloy and has electrical conductivity.

Figure 1B:
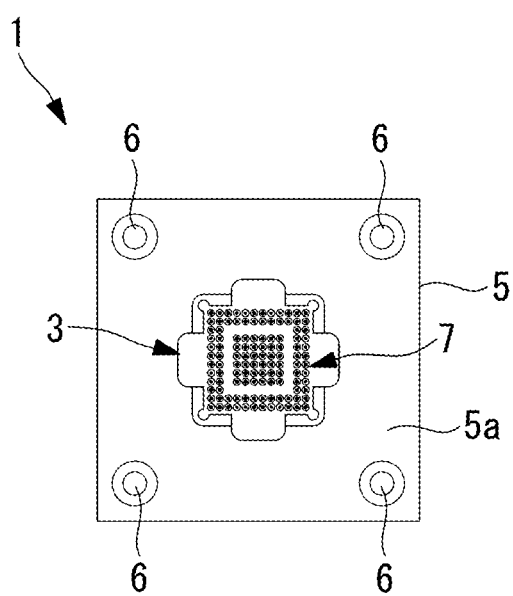
FIG. 1B is a plan view of the test socket of FIG. 1A.

As shown in FIG. 1B, the socket 1 includes a mounting screw hole 6 for mounting in each of four corners. An external crew is inserted into each of the mounting screw holes 6 to fix the socket 1 to a printed circuit board. A housing 7 in which an IC package is put is stored and fixed in the recess 3 formed in the center of the socket 1.

Figure 1C:
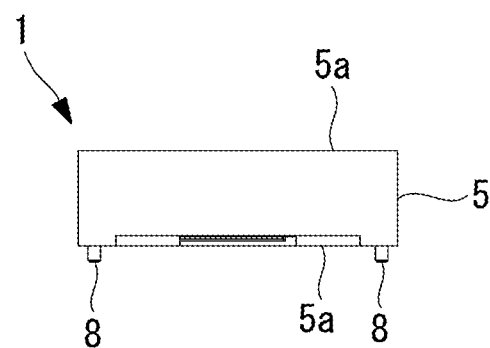
FIG. 1C is a side view of the test socket of FIG. 1A.
Figure 1D:
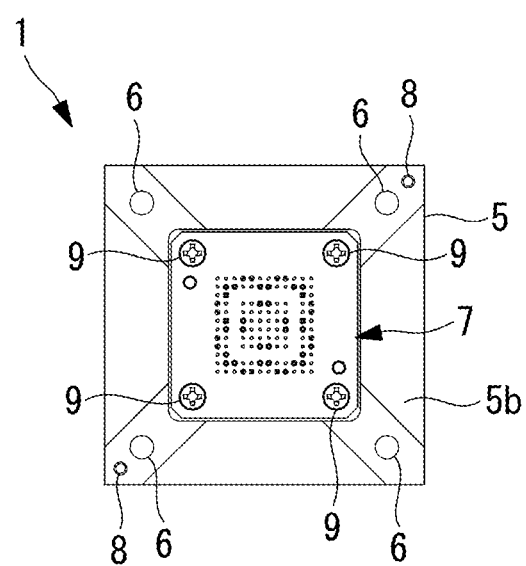
FIG. 1D is a bottom view of the test socket of FIG. 1A.

As shown in FIG. 1C, mounting locating pins 8 are provided protruding downward from the bottom face 5b of the socket base 5. As shown in FIG. 1D, two mounting locating pins 8 are provided in diagonal corners (upper right corner and lower left corner in FIG. 1D) on the bottom face 5b of the socket base 5.

As shown in FIG. 1D, a housing fixing screw 9 is provided in each of four corners of the housing 7. The housing 7 is fixed to the socket base 5 by the housing fixing screws 9.

Figure 2A:
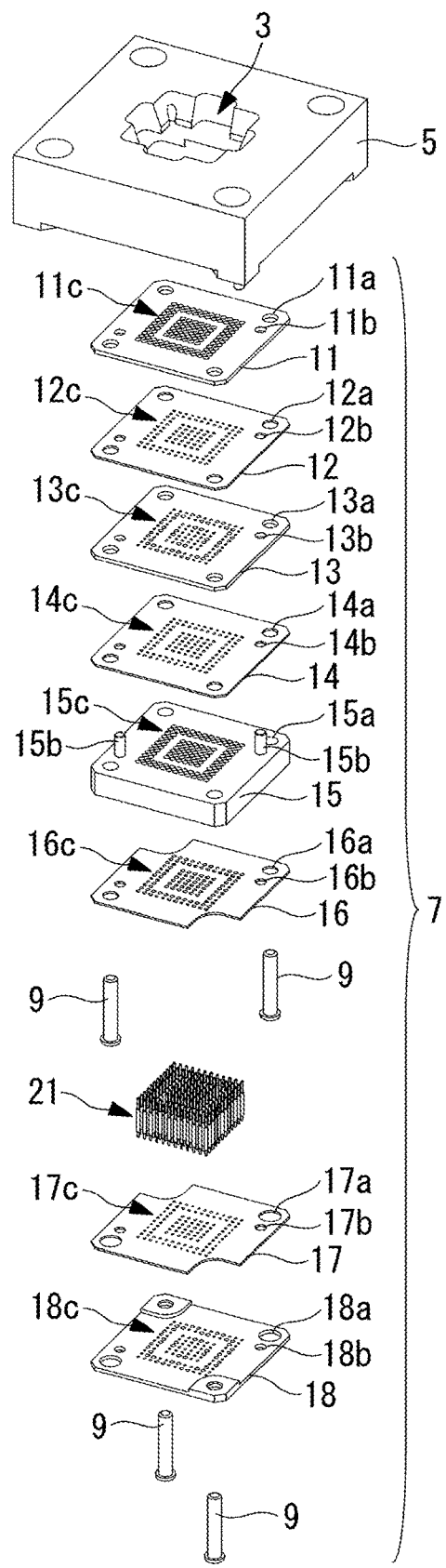
FIG. 2A is an exploded perspective view of the test socket of FIG. 1A.
Figure 2B:
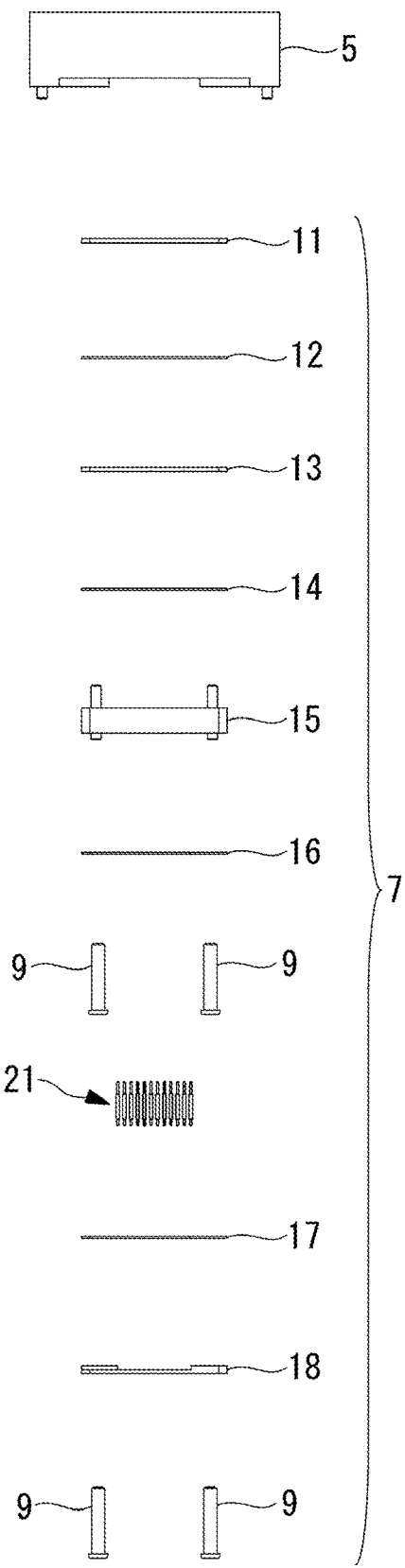
FIG. 2B is a side view of the test socket corresponding to FIG. 2A.

An exploded perspective view of the socket 1 is shown in FIG. 2A and a side view corresponding to FIG. 2A is shown in FIG. 2B.

As shown in FIGS. 2A and 2B, the housing 7 is stored from below and fixed to the socket base 5. The housing 7 has a stacked structure in which plural plate members are stacked in a vertical direction (board thickness direction), including the following from top to bottom in FIGS. 2A and 2B: a first housing (end-side housing) 11, second housing (guiding resin substrate) 12, third housing (end-side housing) 13, fourth housing (guiding resin substrate) 14, fifth housing (central housing) 15, sixth housing (positioning resin substrate) 16, seventh housing (guiding resin substrate) 17, and eighth housing (end-side housing) 18.

Housing fixing screws 9 and contact terminals 21 are provided penetrating the housings 11 to 18.

The first housing 11 is made of metal such as an aluminum alloy and has electrical conductivity. An insulating layer is formed in that region on a top face of the first housing 11 which comes into contact with the IC package. This prevents short circuits between the IC package and first housing 11. As the insulating layer, for example, an anodic oxide film of anodized aluminum or the like or an insulating film formed by coating can be used.

The first housing 11 is a plate-like body whose outside shape is substantially square or rectangular with chamfered corners. The thickness of the first housing 11 is, for example, between 0.03 mm and 1.00 mm (both inclusive), and more specifically around 0.50 mm. A fixing hole 11a is formed in each of four corners of the first housing 11 to pass the housing fixing screw 9 therethrough. Near each of a pair of opposed corners of the first housing 11, a locating-pin hole 11b is formed to pass a locating pin 15b provided on the fifth housing 15 therethrough. In a central region of the first housing 11, plural through-holes 11c are formed to pass the respective contact terminals 21 therethrough. An arrangement of plural through-holes 11c corresponds to positions of terminals in the IC package.

Figure 3:
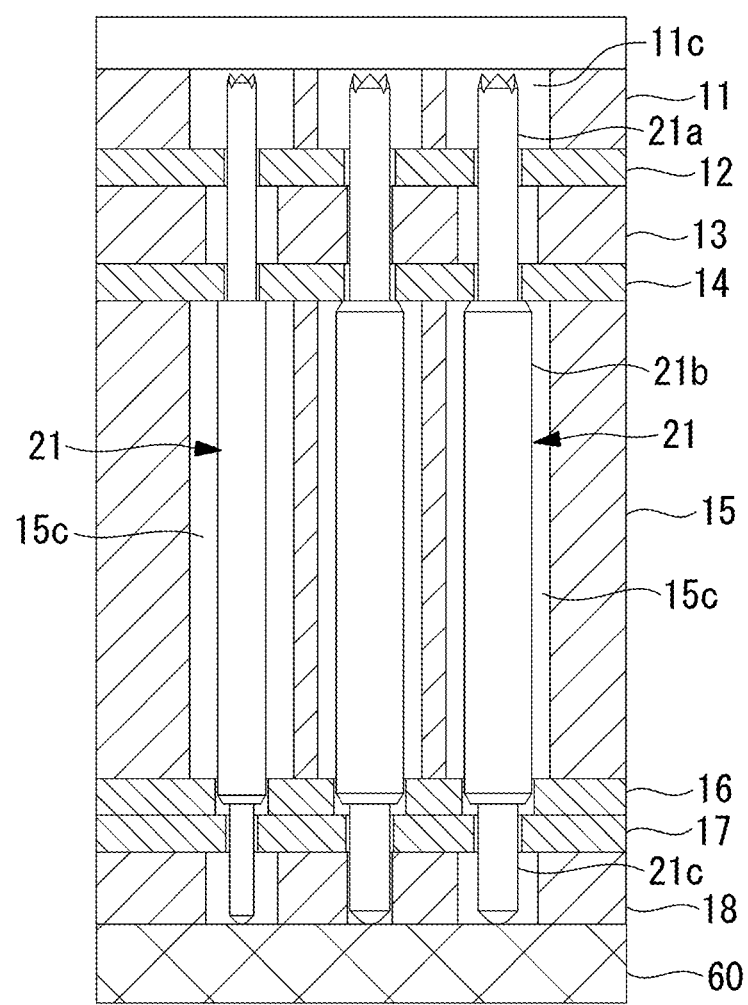
FIG. 3 is a partial longitudinal sectional view showing a housing.
Figure 4:
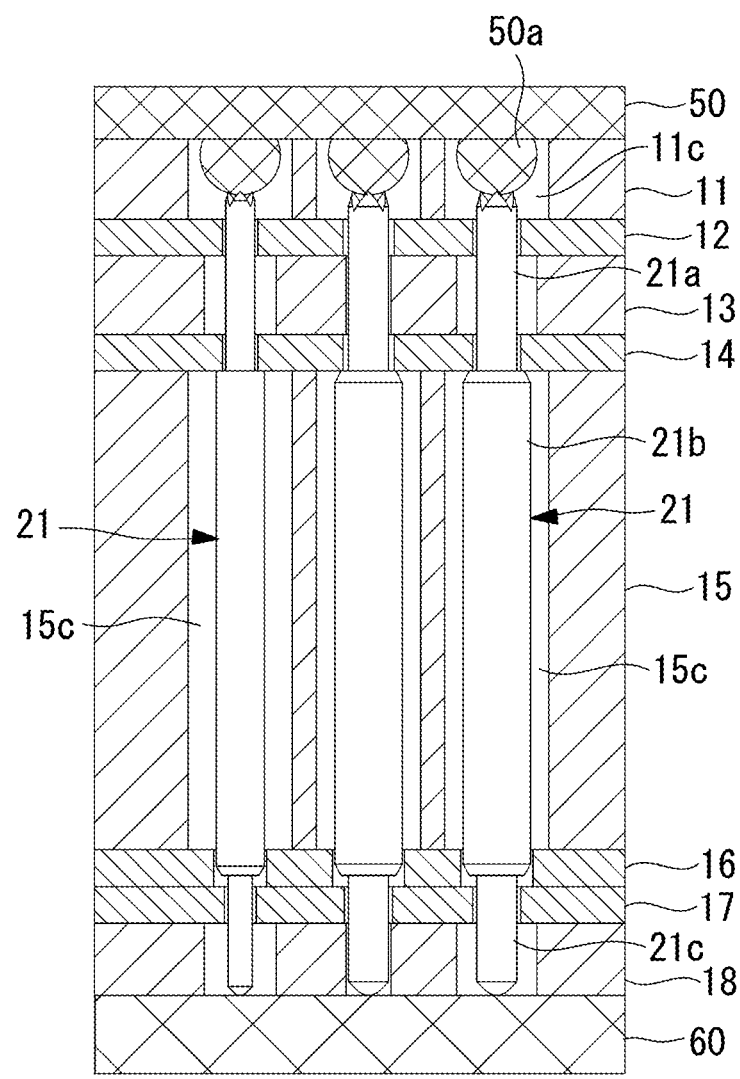
FIG. 4 is a partial longitudinal sectional view showing the housing, an IC package, and a printed circuit board.

As shown in FIG. 3, each of the through-holes 11c has a cylindrical shape whose diameter is constant in the board thickness direction of the first housing 11. Each through-hole 11c is larger in diameter than a device-side plunger 21a of the contact terminal 21. Furthermore, as shown in FIG. 4, each through-hole 11c is larger in diameter than a solder ball (Sn alloy ball) 50a provided on a bottom face of the IC package 50.

As shown in FIGS. 2A and 2B, the second housing 12 is a rigid substrate, which is a resin substrate having rigidity. Specifically, the second housing 12 is a printed circuit board (PCB). As the printed circuit board, a glass epoxy substrate or polyimide (PI) substrate is used, and preferably a substrate higher in strength than a polyetherimide (PEI) substrate is used, where the glass epoxy substrate is produced by weaving glass fiber into cloth-like, glass woven fabric and impregnating the glass woven fabric with epoxy resin.

Metal layers as electrically conductive layers are formed on front and back surfaces of the second housing 12, which is a printed circuit board. Also, to conduct electricity between plated layers on the front and back surfaces, through-vias, which are plated holes, are provided. Therefore, the second housing 12 is electrically connected with the first housing 11 above as well as with the third housing 13 below while electrically interconnecting the first housing 11 and third housing 13.

The second housing 12 is a plate-like body whose outside shape is substantially square or rectangular with chamfered corners. The second housing 12 substantially coincides in outside shape with the first housing 11 in planar view. The thickness of the second housing 12 is, for example, from 0.10 mm (inclusive) to 1.00 mm (inclusive or exclusive), and more specifically 0.02 mm. A fixing hole 12a is formed in each of four corners of the second housing 12 to pass the housing fixing screw 9 therethrough. Near each of a pair of opposed corners of the second housing 12, a locating-pin hole 12b is formed to pass a locating pin 15b provided on the fifth housing 15 therethrough. In a central region of the second housing 12, plural through-holes 12c are formed to pass the respective contact terminals 21 therethrough. An arrangement of the plural through-holes 12c corresponds to positions of terminals in the IC package.

As shown in FIG. 3, each of the through-holes 12c has a cylindrical shape whose diameter is constant in the board thickness direction of the second housing 12. Each through-hole 12c is slightly larger in diameter than the device-side plunger 21a of the contact terminal 21 and smaller than the through-hole 11c in the first housing 11. Each through-hole 12c is a guide hole configured to guide reciprocating motion of the device-side plunger 21a of the contact terminal 21. For this, the diameter of each through-hole 12c is set to provide a predetermined gap between the through-hole 12c and device-side plunger 21a such that the device-side plunger 21a of the contact terminal 21 will not be inclined from a central axis even when reciprocating in an axial direction. The gap is, for example, between 10 μm and 50 μm (both inclusive).

Figure 5A:
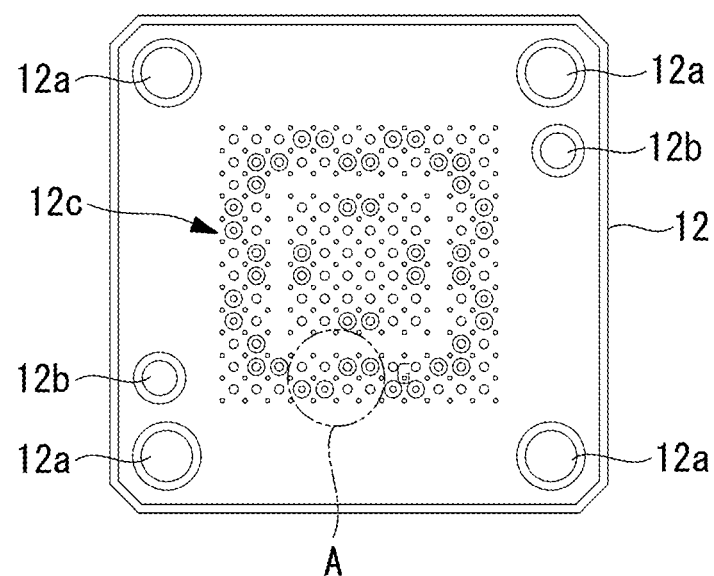
FIG. 5A is a plan view showing a second housing.
Figure 5B:
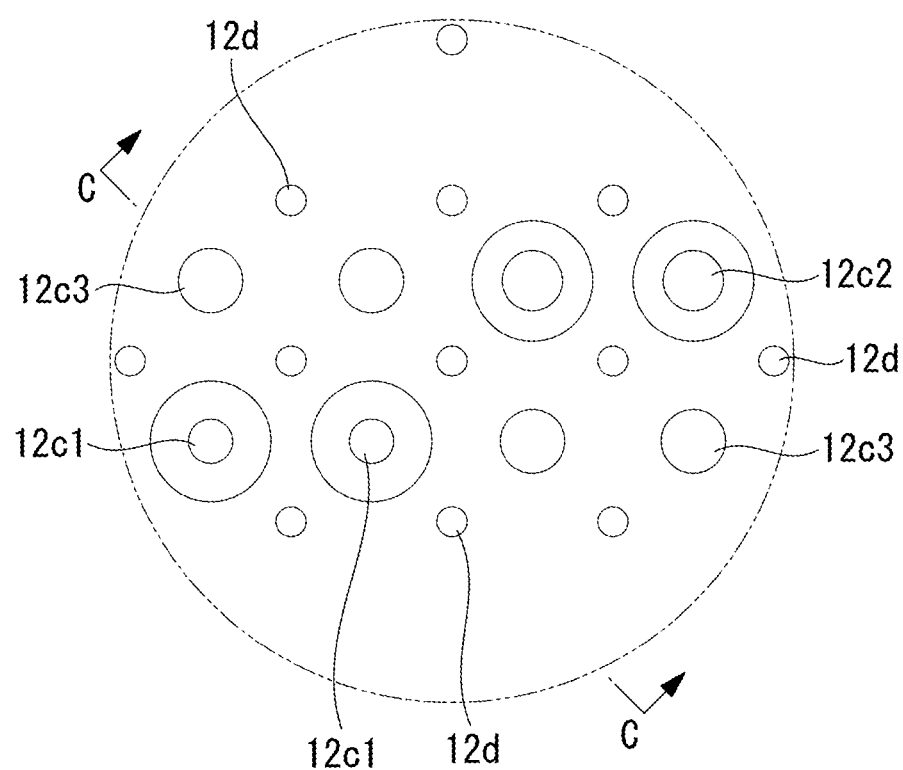
FIG. 5B is an enlarged view showing part A of FIG. 5A.
Figure 5C:
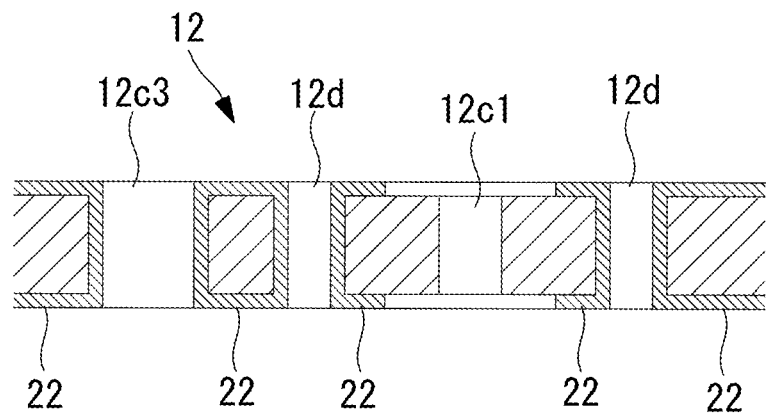
FIG. 5C is a sectional view taken along line C-C in FIG. 5B.

A plan view of the second housing 12 is shown in FIG. 5A. An enlarged view of part A of FIG. 5A is shown in FIG. 5B. As shown in FIG. 5B, signal through-holes 12c1 through which signal contact terminals out of the contact terminals 21 are passed and power-supply through-holes 12c2 through which power-supply contact terminals are passed are non-plated holes on which no plating has been applied. That is, the second housing 12 is electrically insulated from the signal contact terminals and power-supply contact terminals. Specifically, as shown in FIG. 5C, plated layers (electrically conductive layers) 22 have been removed from an entire inner circumferential wall of each signal through-hole 12c1 and part of the front and back surfaces connected to the inner circumferential wall. Consequently, resin layers are exposed on these regions.

On the other hand, grounding through-holes 12c3 through which grounding contact terminals are passed are plated holes in which a plated layer 22 is formed. Therefore, the grounding through-holes 12c3 are also used as through-vias.

As shown in FIG. 5B, in a region in which no through-hole 12c is provided, plural through-vias 12d are provided. In particular, it is preferable to provide a through-via 12d between each pair of adjacent signal through-holes 12c1 or between each pair of a signal through-hole 12c1 and power-supply through-hole 12c2. This reduces crosstalk between the signal contact terminals and power-supply contact terminals.

As with the first housing 11, the third housing 13 is made of metal such as an aluminum alloy and has electrical conductivity. However, unlike the first housing 11, the third housing 13 has no insulating layer formed on either the front surface or back surface. Therefore, the third housing 13 is electrically connected to the second housing 12 above and fourth housing 14 below. The third housing 13 is similar in outside shape to the first housing 11, and has fixing holes 13a, locating-pin holes 13b, and through-holes 13c formed therein. As shown in FIG. 3, the through-holes 13c in the third housing 13 are smaller in diameter than the through-holes 11c in the first housing 11. However, the through-holes 13c in the third housing 13 are larger in diameter than the through-holes 12c in the second housing 12.

As with the second housing 12, the fourth housing 14 is a rigid substrate, which is a resin substrate having rigidity. As with the second housing 12, the fourth housing 14 has plated layers formed on front and back surfaces and through-vias provided to conduct electricity between the plated layers on the front and back surfaces. Therefore, the fourth housing 14 is electrically connected with the third housing 13 above as well as with the fifth housing 15 below while electrically interconnecting the third housing 13 and fifth housing 15.

The fourth housing 14 is similar in shape to the second housing 12 described with reference to FIGS. 5A to 5C. Locating-pin holes 14b are formed in the fourth housing 14 to pass the locating pins 15b therethrough. As shown in FIG. 3, the through-holes 14c in the fourth housing 14 are smaller in diameter than barrels 21b. Besides, an undersurface (back surface) of the fourth housing 14 is placed in such a way as to coincide with upper ends of the barrels 21b of the contact terminals 21 in a height direction (axial direction). Consequently, shoulders of the barrels 21b are restrained by the through-holes 14c, keeping the contact terminals 21 from jumping out. Therefore, the through-holes 14c position the contact terminals 21 while serving as guide holes configured to guide reciprocating motion of the device-side plungers 21a of the contact terminals 21.

As with the first housing 11, the fifth housing 15 is made of metal such as an aluminum alloy and has electrical conductivity. However, unlike the first housing 11, the fifth housing 15 has no insulating layer formed on either the front surface or back surface. Therefore, the fifth housing 15 is electrically connected to the fourth housing 14 above and sixth housing 16 below. As with the first housing 11, the fifth housing 15 is substantially square or rectangular in shape in planar view and has fixing holes 15a and through-holes 15c formed therein. At those positions on a top face of the fifth housing 15 which correspond to the locating-pin holes 11b formed in the first housing 11 and the like, the locating pins 15b are provided protruding upward. Also, at those positions on an undersurface of the fifth housing 15 which correspond to the locating-pin holes 16b formed in the sixth housing 16 and the like, the locating pins 15b are provided protruding downward.

As shown in FIG. 3, the through-holes 15c in the fifth housing 15 are larger in diameter than the barrels 21b of the contact terminals 21. The diameter of the through-holes 15c is determined such that a coaxial probe can be formed between each through-hole 15c and contact terminal 21, giving desired impedance. The thickness of the fifth housing 15 (dimension in the vertical direction, i.e., in the axial direction) is determined according to the length of the barrels 21b of the contact terminals 21 in the axial direction, and preferably is a dimension slightly shorter than the length of the barrels 21b in the axial direction. This makes it possible to position lower ends of the barrels 21b in the sixth housing 16 and retain the barrels 21b by fixing axial positions in the fourth housing 14 as described later.

As with the second housing 12, the sixth housing 16 is a rigid substrate, which is a resin substrate having rigidity. As with the second housing 12, the sixth housing 16 has plated layers formed on front and back surfaces and through-vias provided to conduct electricity between the plated layers on the front and back surfaces. Therefore, the sixth housing 16 is electrically connected with the fifth housing 15 above as well as with the seventh housing 17 below while electrically interconnecting the fifth housing 15 and seventh housing 17.

The sixth housing 16 is similar in shape to the second housing 12 described with reference to FIGS. 5A to 5C. However, as shown in FIG. 3, the through-holes 16c in the sixth housing 16 have such a diameter as to come into contact with, and fit around, the lower ends of the barrels 21b. Consequently, the through-holes 16c serve as locating holes configured to position the barrels 21b on a horizontal plane (in a direction orthogonal to the axial direction). Thus, the sixth housing 16 is a positioning resin substrate configured to position the contact terminals 21.

As with the second housing 12, the seventh housing 17 is a rigid substrate, which is a resin substrate having rigidity. As with the second housing 12, the seventh housing 17 has plated layers formed on front and back surfaces and through-vias provided to conduct electricity between the plated layers on the front and back surfaces. Therefore, the seventh housing 17 is electrically connected with the sixth housing 16 above as well as with an eighth housing 18 below while electrically interconnecting the sixth housing 16 and eighth housing 18.

The seventh housing 17 is similar in shape to the second housing 12 described with reference to FIGS. 5A to 5C. Locating-pin holes 17b are formed in the seventh housing 17 to pass the locating pins 15b therethrough. As shown in FIG. 3, the through-holes 17c in the seventh housing 17 are smaller in diameter than the barrels 21b. Consequently, shoulders of the barrels 21b are restrained by the through-holes 17c, keeping the contact terminals 21 from jumping out. The through-holes 17c serve as guide holes configured to guide reciprocating motion of substrate-side plungers 21c of the contact terminals 21. For this, the diameter of each through-hole 17c is set to provide a predetermined gap between the through-hole 17c and substrate-side plunger 21c such that the substrate-side plunger 21c of the contact terminal 21 will not be inclined from a central axis even when reciprocating in an axial direction. The gap is set approximately equal to the gap in the through-hole 12c in the second housing 12.

As with the first housing 11, the eighth housing 18 is made of metal such as an aluminum alloy and has electrical conductivity. An insulating layer is formed in that region on an undersurface (back surface) of the eighth housing 18 which comes into contact with a printed circuit board 60 (see FIG. 3). This prevents short circuits between an electrically conductive region formed on the printed circuit board 60 and the eighth housing 18. As the insulating layer, for example, an anodic oxide film of anodized aluminum or the like or an insulating film formed by coating can be used. However, no insulating layer is formed on a top face of the eighth housing 18, and thus the top face is electrically connected with the seventh housing 17.

As with the first housing 11, the eighth housing 18 is substantially square or rectangular in shape in planar view and has fixing holes 18a, locating-pin holes 18b, and through-holes 18c formed therein.

As shown in FIG. 3, the through-holes 18c in the eighth housing 18 is larger in diameter than the substrate-side plungers 21c of the contact terminals 21 and larger than the through-holes 17c in the seventh housing 17.

Figure 6:
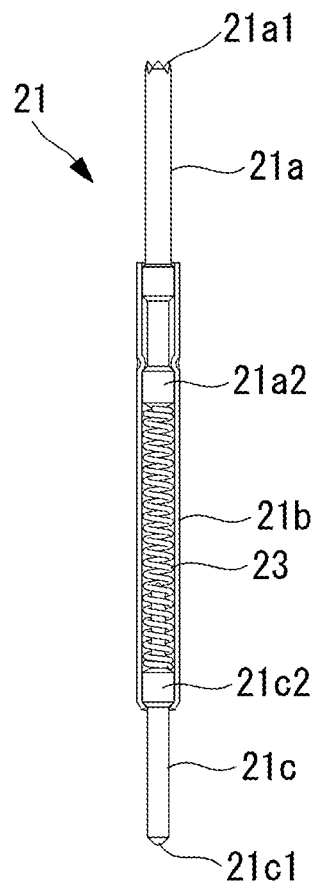
FIG. 6 is a partial sectional side view showing a contact terminal.

A contact terminal 21 is shown in FIG. 6. The contact terminal 21 includes the device-side plunger 21a having a device-side end portion 21a1, the substrate-side plunger 21c having a substrate-side end portion 21c1, and the barrel 21b provided between the device-side plunger 21a and substrate-side plunger 21c.

The device-side end portion 21a1 is placed in contact with a terminal of the IC package 50 and the substrate-side end portion 21c1 is placed in contact with the electrically conductive region formed on the printed circuit board 60. A base-end portion 21a2 of the device-side plunger 21a and a base-end portion 21c2 of the substrate-side plunger 21c are stored in the barrel 21b. A coil spring 23 is provided in the barrel 21b, extending in the axial direction. The base-end portions 21a2 and 21c2 are provided butting opposite ends of the coil spring 23. Consequently, the plungers 21a and 21c are supported reciprocally in the axial direction.

The contact terminal 21 shown in FIG. 6 is an example of a signal contact terminal. A power-supply contact terminal and grounding contact terminal are larger in diameter than the signal contact terminal, but are similar to the signal contact terminal in basic structure.

Next, a method for assembling the above-mentioned socket 1 will be described with reference to FIGS. 7 and 8.

Figure 7:
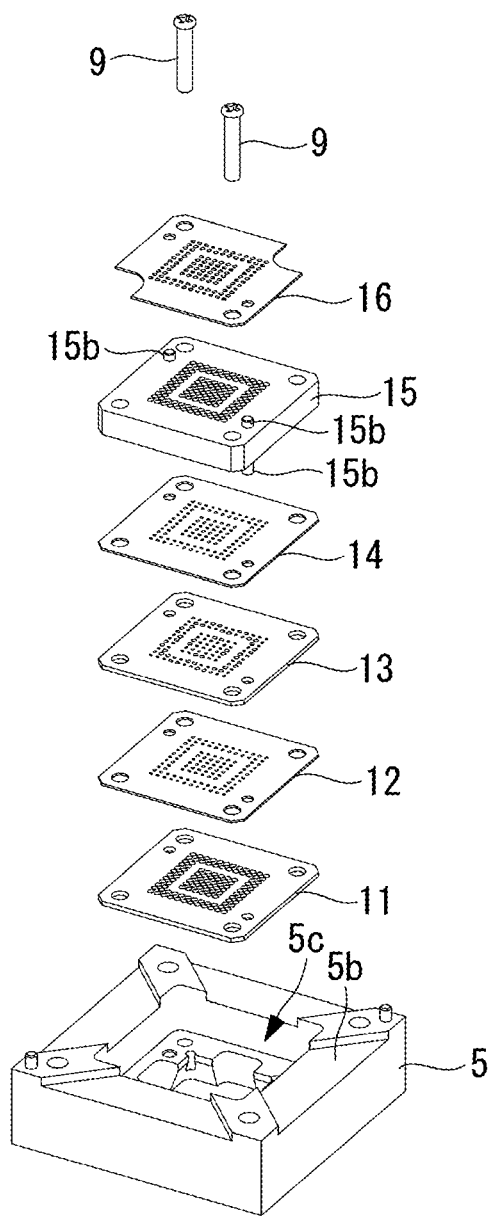
FIG. 7 is an exploded perspective view showing an assembly process of the test socket.

First, as shown in FIG. 7, the socket base 5 is turned upside down, turning the bottom face 5b up. Then, the first housing 11, second housing 12, third housing 13, fourth housing 14, fifth housing 15, and sixth housing 16 are inserted in sequence into a storage recess 5c formed in the socket base 5 and stacked thereon. In so doing, as the locating pins 15b provided on the front and back surfaces of the fifth housing 15 are inserted into the locating-pin holes 13b in the first housing 11 and the other housings, relative positioning is done. Then, the housing fixing screws 9 are passed through pairs of diagonally opposite fixing holes 11a, 12a, 13a, 14a, 15a, and 16a in the respective housings 11, 12, 13, 14, 15, and 16 and screwed to the socket base 5, thereby integrally fixing the housings 11, 12, 13, 14, 15, and 16 to the socket base 5.

Figure 8:
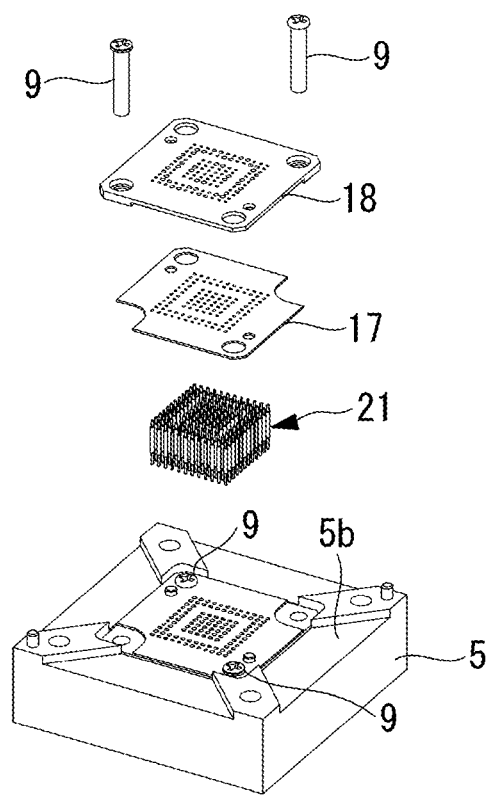
FIG. 8 is an exploded perspective view showing an assembly process of the test socket.

Then, as shown in FIG. 8, the contact terminals 21 are inserted into the through-holes 11c, 12c, 13c, 14c, 15c, and 16c. The contact terminals 21 may be inserted into the through-holes 11c, 12c, 13c, 14c, 15c, and 16c using a mask in which holes corresponding to different diameters of the contact terminals are arranged. The mask is removed after all the contact terminals 21 are inserted.

Next, the seventh housing 17 and eighth housing 18 are stacked in sequence on the sixth housing 16. In so doing, the housings 17 and 18 are positioned by the locating pins 15b provided on the fifth housing 15. Then, the housing fixing screws 9 are passed through the pairs of remaining fixing holes 11a, 12a, 13a, 14a, 15a, 16a, 17a, and 18a in all the housings 11, 12, 13, 14, 15, 16, 17, and 18 and screwed to the socket base 5, thereby integrally fixing all the housings 11, 12, 13, 14, 15, 16, 17, and 18 to the socket base 5 to complete the assembly of the socket 1.

Note that when testing is continued using the socket 1, contacts of contact terminals 21 will be worn or the like, which may result in the need for maintenance. In that case, by simply removing a pair of diagonally opposite housing fixing screws 9 and the seventh housing 17 and eighth housing 18, the contact terminals 21 can be plugged and unplugged. This improves maintainability.

The present embodiment achieves the following operations and effects.

By stacking the sixth housing 16 on the fifth housing 15 and passing the contact terminals 21 through the through-holes 16c in the sixth housing 16, the contact terminals 21 are positioned in a direction orthogonal to the axial direction. Consequently, impedance matching is performed accurately.

Since the sixth housing 16 made of a resin substrate has through-vias as a conductive portion configured to form a conducting path in the axial direction, electricity is conducted between the fifth housing 15 and the seventh housing 17 or eighth housing 18 through the sixth housing 16. Consequently, impedance matching can be performed accurately despite the interposition of the sixth housing 16 made of a resin substrate. Therefore, inspection can be performed accurately on high frequency signals, for example, in excess of 10 GHz.

Whereas the device-side plungers 21a and substrate-side plungers 21c reciprocate in the axial direction, the barrels 21b cannot reciprocate in the axial direction. Therefore, by positioning the contact terminals 21 by placing the through-holes 16c formed in the sixth housing 16 in contact with the barrels 21b, positioning can be done more accurately.

Serving as guiding resin substrates provided with the through-hole 12c, 14c, and 17c configured to guide the reciprocating motion of the plungers 21a and 21c, the second housing 12, fourth housing 14, and seventh housing 17 allow the plungers 21a and 21c to be reciprocated accurately along the axial direction. This makes it possible to prevent the plungers from touching surrounding components (e.g., first housing 11, third housing 13, and eighth housing 18 having electrical conductivity) by inhibiting inclination of motion from the axial directions of the plungers even if reciprocating strokes of the plungers 21a and 21c are long and thereby prevent malfunctions.

Since the second housing 12, fourth housing 14, and seventh housing 17 serving as guiding resin substrates has through-vias as with the sixth housing 16 serving as a positioning resin substrate, by conducting electricity in the stacking direction, impedance matching can be performed accurately.

Printed circuit boards (PCB) are used for the second housing 12, fourth housing 14, sixth housing 16, and seventh housing 17, which are resin substrates. The printed circuit boards, whose manufacturing process has technically been established, can be produced with high processing accuracy at relatively low cost. Also, because rigid substrates having rigidity are used as the printed circuit boards, board thickness can be reduced and the influence on impedance matching can be minimized.

Also, as a printed circuit board, plural layers of rigid substrates may be provided or only flexible substrates or a combination of a flexible substrate and rigid substrate may be used.

By forming plated layers as electrically conductive layers on the front and back surfaces of the second housing 12, fourth housing 14, sixth housing 16, and seventh housing 17, which are resin substrates and providing through-vias between the plated layers on the front and back surfaces, a conductive path can be formed in the stacking direction (board thickness direction) of the resin substrates.

A signal contact terminal and power-supply contact terminal may become electrically coupled in a region of a resin substrate and might be affected by crosstalk. Thus, crosstalk can be reduced by providing through-vias (e.g., reference sign 12*d* in FIG. 5B) between the signal contact terminal and power-supply contact terminal.

By forming an insulating layer in that region of the first housing 11 which is placed in contact with the IC package 50 and forming an insulating layer in that region of the eighth housing 18 which is placed in contact with the printed circuit board 60, short circuits with the housings 11 and 18 can be avoided.

Figure 9:
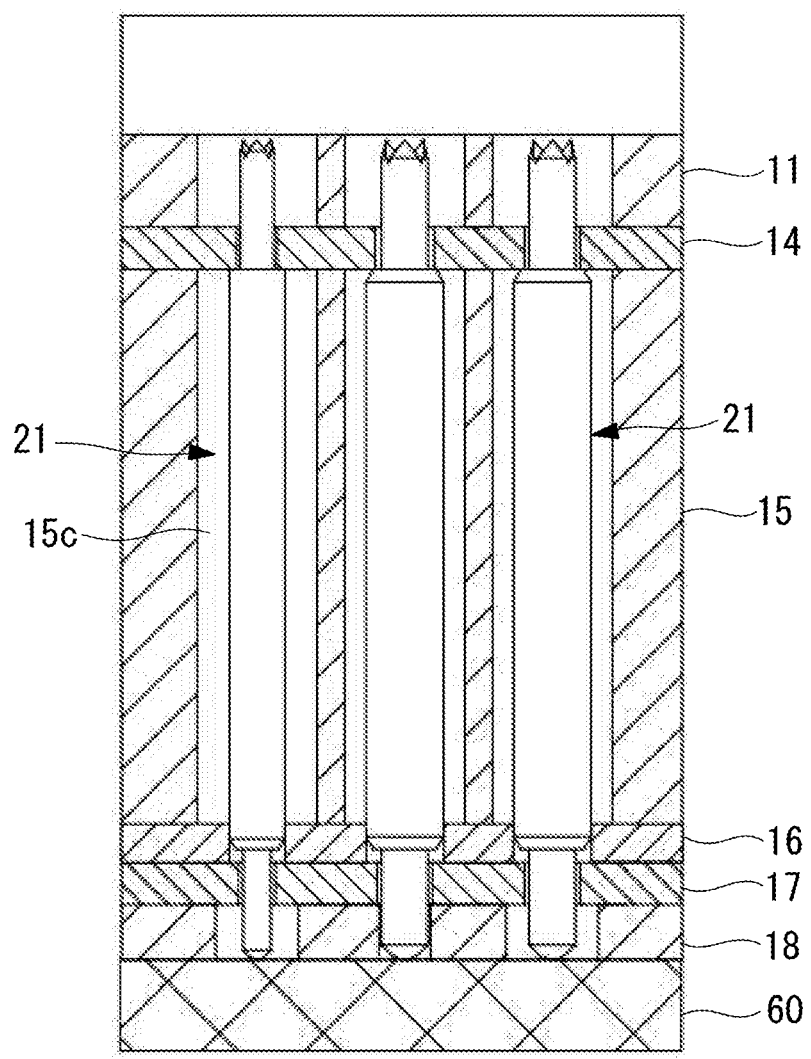
FIG. 9 is a partial longitudinal sectional view showing a first modification of the test socket.
Figure 10:
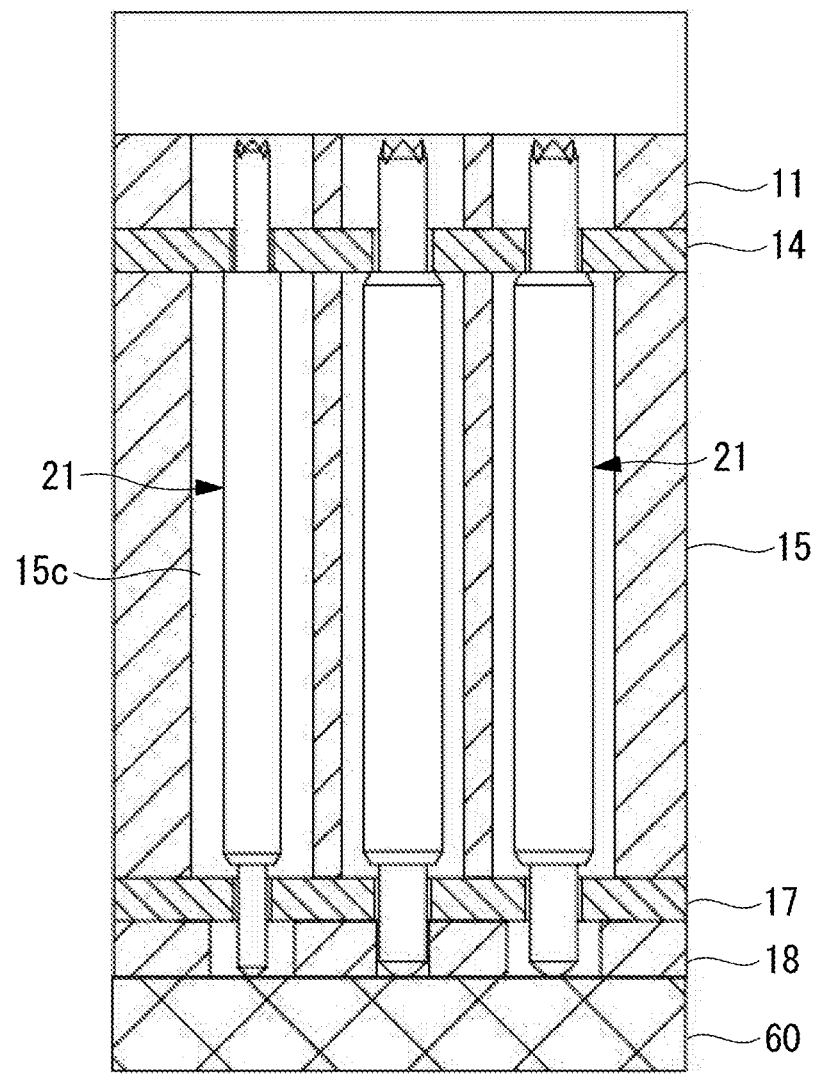
FIG. 10 is a partial longitudinal sectional view showing the first modification of the test socket.

Note that although four resin substrates: the second housing 12, fourth housing 14, sixth housing 16, and seventh housing 17, are used in the embodiment described above, the present invention is not limited to this. For example, as shown in FIG. 9, three resin substrates may be used by omitting the second housing 12. Also, as shown in FIG. 10, two resin substrates may be used by omitting the second housing 12 and sixth housing 16. Even with the configuration of FIG. 9 or 10, since at least two resin substrates are provided the contact terminals 21 can be positioned. Also, when the second housing 12 is omitted, the third housing 13 can also be omitted. In that case, the first housing 11 and socket base 5 may be integrated into a single part to reduce the number of parts.

Figure 11:
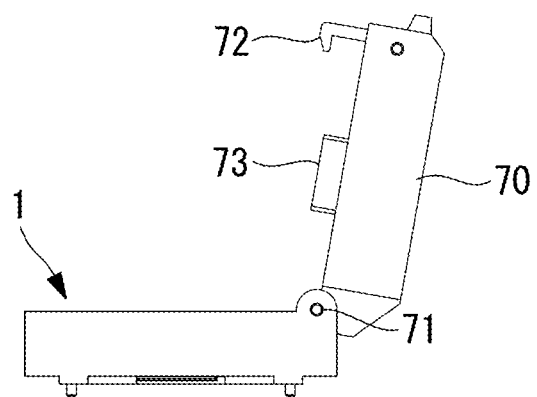
FIG. 11 is a side view showing a test socket equipped with a cover unit.
Figure 12:
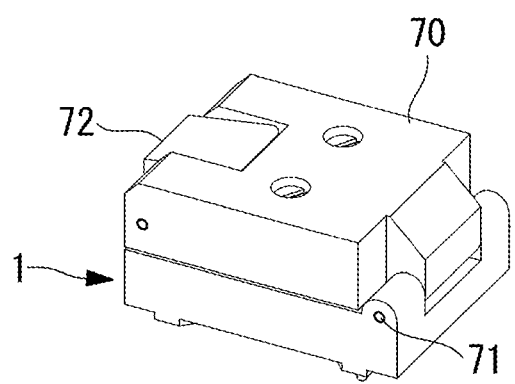
FIG. 12 is a perspective view showing the test socket equipped with a cover unit.

Also, whereas the top face of the socket 1 is open in the embodiment described above, a cover unit may be provided to accommodate manual testing and the like. Specifically, as shown in FIG. 11, a cover unit 70 is pivotally attached to one side of the above-mentioned socket 1 via a hinge 71. A latch 72 is provided in that position of the cover unit 70 which faces the hinge 71 such that the cover unit 70 can be fixed in a closed state when closed as shown in FIG. 12. A pressing portion 73 is provided on an undersurface of the cover unit 70, protruding downward. The IC package is pressed by the pressing portion 73 at a desired pressure.

REFERENCE SIGNS LIST

1 Socket (test socket)
3 Recess
5 Socket base
5*a* Top face
5*b* Bottom face
5*c* Storage recess
6 Mounting screw hole
7 Housing
8 Mounting locating pin
9 Housing fixing screw
11 First housing (end-side housing)
11*a* Fixing hole
11*b* Locating-pin hole
11*c* Through-hole
12 Second housing (guiding resin substrate)
12*a* Fixing hole
12*b* Locating-pin hole
12*c* Through-hole (guide hole)
13 Third housing (end-side housing)
13*a* Fixing hole
13*b* Locating-pin hole
13*c* Through-hole
14 Fourth housing (guiding resin substrate)
14*a* Fixing hole
14*b* Locating-pin hole
14*c* Through-hole (locating hole, guide hole)
15 Fifth housing (central housing)
15*a* Fixing hole
15*b* Locating pin
15*c* Through-hole
16 Sixth housing (positioning resin substrate)
16*a* Fixing hole
16*b* Locating-pin hole
16*c* Through-hole (locating hole)
17 Seventh housing (guiding resin substrate, positioning resin substrate)
17*a* Fixing hole
17*b* Locating-pin hole
17*c* Through-hole (guide hole)
18 Eighth housing (end-side housing)
18*a* Fixing hole
18*b* Locating-pin hole
18*c* Through-hole
21 Contact terminal
21*a* Device-side plunger
21*a*1 Device-side end portion
21*a*2 Base-end portion
21*b* Barrel
21*c* Substrate-side plunger
21*c*1 Substrate-side end portion
21*c*2 Base-end portion
22 Plated layer
23 Coil spring
50 IC package
50*a* Solder ball
60 Printed circuit board (test board)
70 Cover unit
71 Hinge
72 Latch
73 Pressing portion

The invention claimed is:

1. A test socket comprising:
a plurality of contact terminals each having a device-side end portion at one end in an axial direction and a substrate-side end portion at another end on a side opposite the device-side end portion, the device-side end portion being configured to come into contact with a device under test, the substrate-side end portion being configured to come into contact with a test board;
a central housing located in a central part of the contact terminals in the axial direction and having electrical conductivity, a plurality of through-holes being formed in the central housing to pass the respective contact terminals therethrough;
a positioning resin substrate stacked in the axial direction on the central housing, locating holes being formed in the positioning resin substrate, the locating holes being configured to position the contact terminals in a direction orthogonal to the axial direction; and
an end-side housing having electrical conductivity and stacked in the axial direction by sandwiching the positioning resin substrate between the end-side housing and the central housing,
wherein the end-sided housing includes a first surface and a second surface placed opposite the first surface,
wherein the first surface is electrically connected to the positioning resin substrate,
wherein the second surface is insulated from the test board, and
wherein the positioning resin substrate includes a conductive portion configured to form a conductive path in the axial direction.

2. The test socket according to claim 1, wherein:
  each of the contact terminals includes a device-side plunger having the device-side end portion, a substrate-side plunger having the substrate-side end portion, and a barrel provided between the device-side plunger and the substrate-side plunger and configured to support a base end side of the device-side plunger and a base end side of the substrate-side plunger reciprocally in the axial direction; and
  the locating holes formed in the positioning resin substrate are placed in contact with the barrel.

3. The test socket according to claim 2, further comprising a guiding resin substrate provided with a conductive portion configured to form a conductive path in the axial direction, guide holes being formed in the guiding resin substrate to guide reciprocating motion of the device-side plunger and/or the substrate-side plunger in the axial direction.

4. The test socket according to claim 3, wherein the positioning resin substrate and/or the guiding resin substrate are printed circuit boards/is a printed circuit board.

5. The test socket according to claim 4, wherein the conductive portion includes electrically conductive layers formed on front and back surfaces of the positioning resin substrate and/or the guiding resin substrate, and through-vias provided to conduct electricity between the electrically conductive layer(s) on the front surface(s) and the electrically conductive layer(s) on the back surface(s).

6. The test socket according to claim 5, wherein:
  the contact terminals include a signal contact terminal and a power-supply contact terminal; and
  the through-vias are provided between the locating hole and/or the guide hole through which the signal contact terminal is passed and the locating hole and/or the guide hole through which the power-supply contact terminal is passed.

7. The test socket according to claim 1, further comprising:
  a device-side housing placed in contact with the device under test;
  a substrate-side housing placed in contact with the test board; and
  an insulating layer formed in a region of the device-side housing, the region of the device-side housing being placed in contact with the device under test, and/or an insulating layer is formed in a region of the substrate-side housing, the region of the substrate-side housing being placed in contact with the test board.

8. The test socket according to claim 1, further comprising an insulating layer in a region on the second surface.

9. The test socket according to claim 8, wherein the second surface is an undersurface of the end-side housing.

10. A test socket comprising:
  a plurality of contact terminals each having a device-side end portion at one end in an axial direction and a substrate-side end portion at another end on a side opposite the device-side end portion, the device-side end portion being configured to come into contact with a device under test, the substrate-side end portion being configured to come into contact with a test board;
  a central housing located in a central part of the contact terminals in the axial direction and having electrical conductivity, a plurality of through-holes being formed in the central housing to pass the respective contact terminals therethrough;
  a positioning resin substrate stacked in the axial direction on the central housing, locating holes being formed in the positioning resin substrate, the locating holes being configured to position the contact terminals in a direction orthogonal to the axial direction;
  an end-side housing having electrical conductivity and stacked in the axial direction by sandwiching the positioning resin substrate between the end-side housing and the central housing, the end-sided housing including:
    a top surface electrically connected to the positioning resin substrate; and an under surface opposite the top surface; and
    insulating layer in a region on the under surface to insulated the under surface from the test board,
  wherein the positioning resin substrate includes a conductive portion configured to form a conductive path in the axial direction.

11. The test socket according to claim 10, wherein the end-side housing is devoid of an insulating layer on the top surface.

* * * * *